(12) United States Patent
Endo

(10) Patent No.: US 11,391,758 B2
(45) Date of Patent: Jul. 19, 2022

(54) TESTING APPARATUS AND METHOD OF CONTROLLING TESTING APPARATUS

(71) Applicant: Tokyo Electron Limited, Tokyo (JP)

(72) Inventor: Tomoya Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/209,400

(22) Filed: Mar. 23, 2021

(65) Prior Publication Data

US 2021/0311094 A1 Oct. 7, 2021

(30) Foreign Application Priority Data

Apr. 6, 2020 (JP) .............................. JP2020-068425

(51) Int. Cl.
*G01R 31/28* (2006.01)
*G01R 1/067* (2006.01)
*G01R 1/073* (2006.01)

(52) U.S. Cl.
CPC ..... *G01R 1/06794* (2013.01); *G01R 1/06722* (2013.01); *G01R 1/07307* (2013.01); *G01R 31/2831* (2013.01)

(58) Field of Classification Search
CPC ............ G01R 1/06794; G01R 1/06722; G01R 1/07307; G01R 31/2831
See application file for complete search history.

(56) References Cited

U.S. PATENT DOCUMENTS

| 2003/0025495 A1* | 2/2003 | Ilno | G01R 31/2887 |
| | | | 324/750.22 |
| 2012/0242359 A1* | 9/2012 | Obi | G01R 31/2891 |
| | | | 324/750.16 |

FOREIGN PATENT DOCUMENTS

JP 2012-204695 10/2012

* cited by examiner

*Primary Examiner* — Paresh Patel
(74) *Attorney, Agent, or Firm* — IPUSA, PLLC

(57) ABSTRACT

A testing apparatus includes a first coordinates obtaining unit, a second coordinates obtaining unit, and a controller that performs determining card gravity center coordinates of a probe card held at a pogo frame opposite to an alignment stage, determining reference coordinates in a target coordinate system of a reference target at predetermined coordinates, determining alignment coordinates when the first coordinates obtaining unit is aligned with the second coordinates obtaining unit, determining wafer gravity center coordinates of a wafer, and calculating contact coordinates by using the determined card gravity center coordinates, the determined alignment coordinates, and the determined wafer gravity center coordinates. The controller further performs determining actual contact coordinates at the calculated contact coordinates, calculating reference contact coordinates based on the determined reference coordinates, and correcting a position of the alignment stage based on a positional difference between the determined actual contact coordinates and the calculated reference contact coordinates.

6 Claims, 8 Drawing Sheets

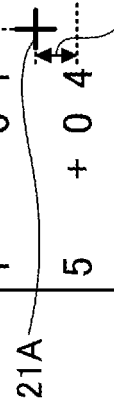
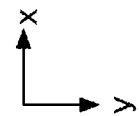

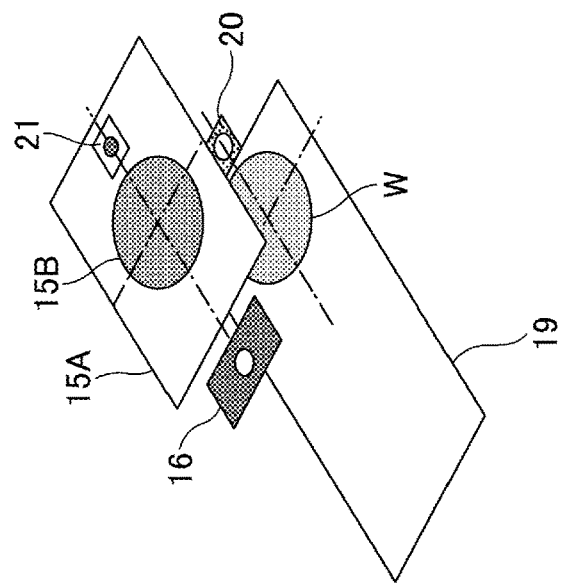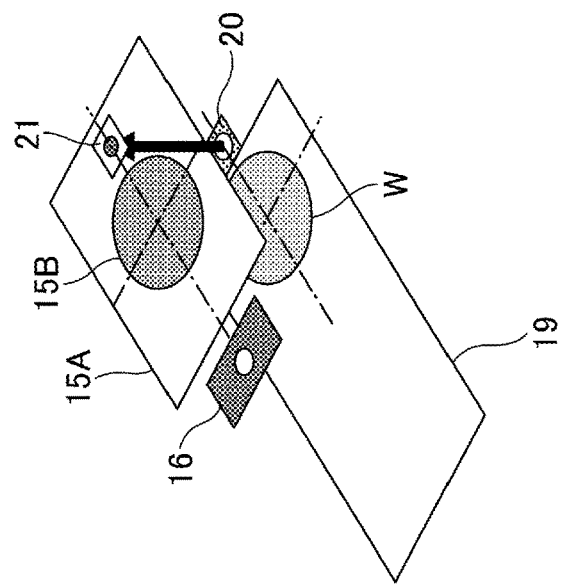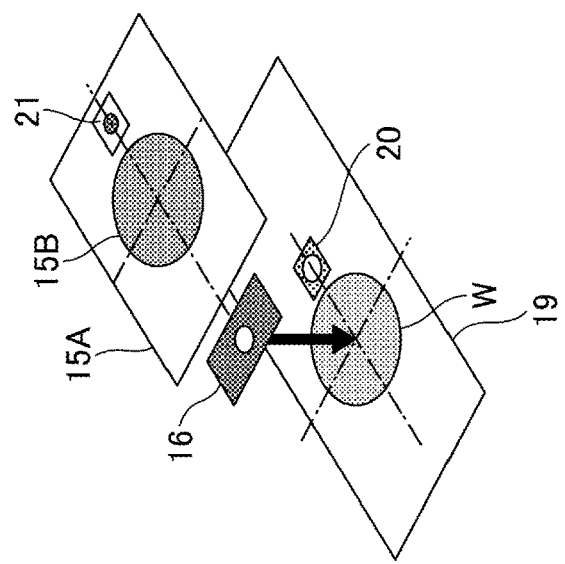

TESTING APPARATUS AND METHOD OF CONTROLLING TESTING APPARATUS

CROSS-REFERENCE TO RELATED APPLICATIONS

This patent application is based on and claims priority to Japanese Patent Application No. 2020-068425 filed on Apr. 6, 2020, the entire contents of which are incorporated herein by reference.

TECHNICAL FIELD

The present disclosure relates to a testing apparatus and a method of controlling the testing apparatus.

BACKGROUND

Patent Document 1 discloses a technique relating to a probe card detecting apparatus that detects differences between horizontal positions of needle tips of two probes and horizontal positions of two targets by using first and second cameras that detect the needle tips of the probes or the targets, as correction values used to align the probes and electrode pads of semiconductor wafers.

The present disclosure provides a technique that improves positional accuracy when a wafer placed on an alignment stage is moved to a position where the wafer is in contact with a probe of a probe card.

RELATED ART DOCUMENT

Patent Document

[Patent Document 1] Japanese Laid-open Patent Application Publication No. 2012-204695.

SUMMARY

According to one aspect of the present disclosure, a testing apparatus includes an alignment stage, a pogo frame provided opposite to the alignment stage, a reference target provided on the pogo frame, a first coordinates obtaining unit fixed relative to the alignment stage, a second coordinates obtaining unit fixed relative to the pogo frame, and a controller. The controller is configured to perform processes of determining card gravity center coordinates of a probe card held at the pogo frame by using the first coordinates obtaining unit, the card gravity center coordinates being coordinates in a coordinate system of the testing apparatus, positioning the alignment stage at a predetermined position and determining reference coordinates of the first coordinates obtaining unit by using the first coordinates obtaining unit in response to the alignment stage being positioned at the predetermined position, the reference coordinates being coordinates in a target coordinate system, and an origin of the target coordinate system being the reference target, aligning the first coordinates obtaining unit with the second coordinates obtaining unit and determining alignment coordinates of the first coordinates obtaining unit in response to the first coordinates obtaining unit being aligned with the second coordinates obtaining unit, the alignment coordinates being coordinates in the coordinate system of the testing apparatus, determining wafer gravity center coordinates of a wafer placed on the alignment stage by using the second coordinates obtaining unit, the wafer gravity center coordinates being coordinates in the coordinate system of the testing apparatus, and calculating contact coordinates of the alignment stage based on the determined card gravity center coordinates, the determined alignment coordinates, and the determined wafer gravity center coordinates, the contact coordinates being expected to be coordinates to which the alignment stage is moved to allow the wafer to come in contact with the probe. The controller is further configured to perform processes of positioning the alignment stage by using a command including the calculated contact coordinates and determining actual contact coordinates of the first coordinates obtaining unit by using the first coordinates obtaining unit in response to the alignment stage being positioned by using the command including the calculated contact coordinates, the actual contact coordinates being in the target coordinate system, calculating reference contact coordinates based on the determined reference coordinates, the reference contact coordinates being coordinates of the first coordinates obtaining unit as would be observed when the alignment stage is assumed to be situated at the calculated contact coordinates to allow the wafer to come in contact with the probe, and the reference contact coordinates being in the target coordinate system, and causing the wafer to contact the probe by correcting a position of the alignment stage based on a positional difference between the determined actual contact coordinates and the calculated reference contact coordinates.

According to one aspect of the present disclosure, positional accuracy when a wafer placed on an alignment stage is moved to a position where the wafer is in contact with a probe of a probe card can be improved.

BRIEF DESCRIPTION OF THE DRAWINGS

FIGS. 4A, 4B, and 4C are drawings illustrating a correction target;

FIGS. 7A, 7B, and 7C are drawings illustrating an example of the process of causing the wafer to contact with the probe card.

DETAILED DESCRIPTION OF EMBODIMENTS

Figure 1:
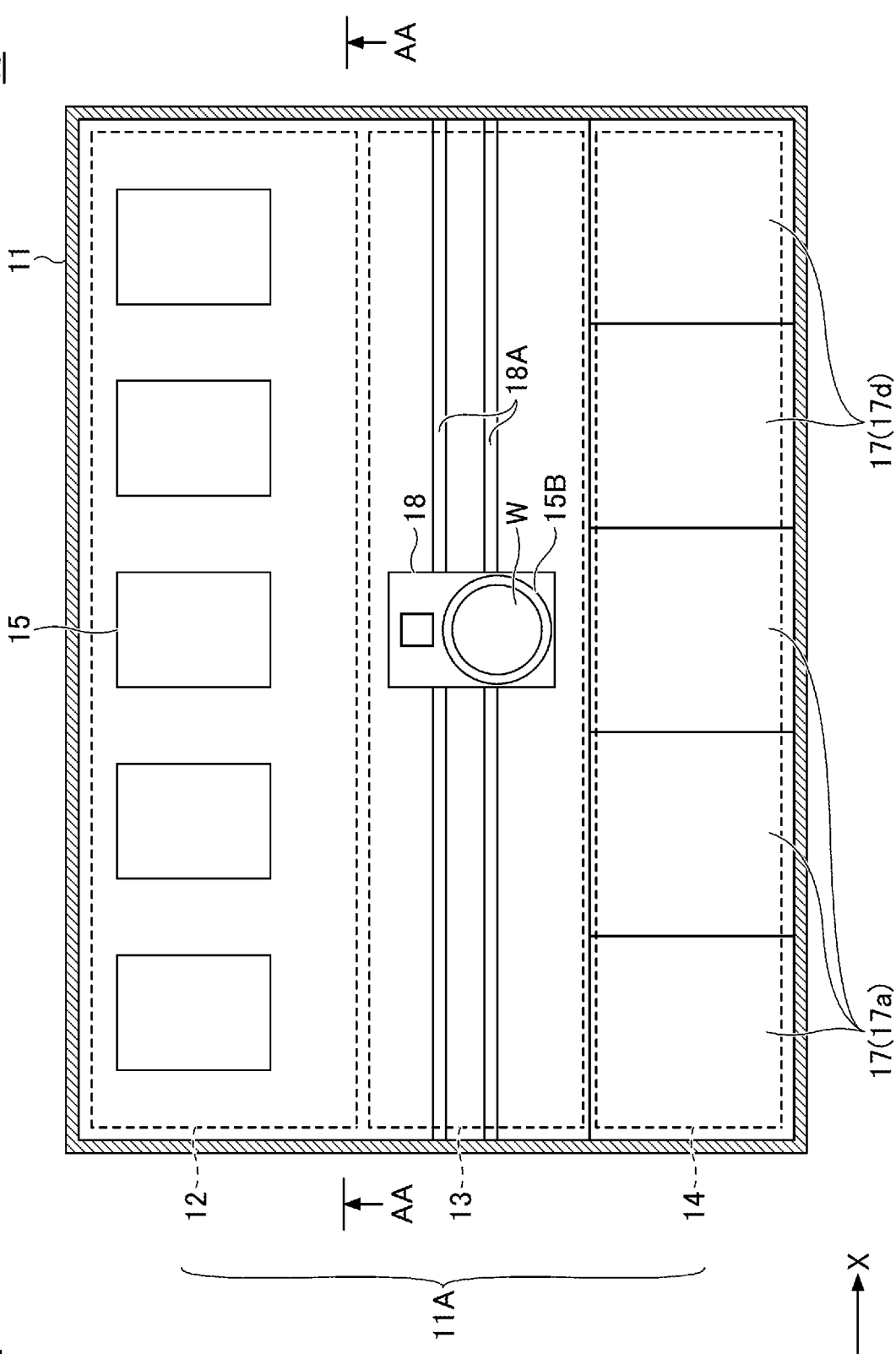
FIG. 1 is a cross-sectional view illustrating an example of a testing apparatus according to an embodiment.

In the following, an embodiment of the present disclosure will be described with reference to the drawings. In the specification and the drawings, the same reference numerals may be used to refer to substantially the same components and overlapping descriptions may be omitted.

Embodiment

Figure 2:
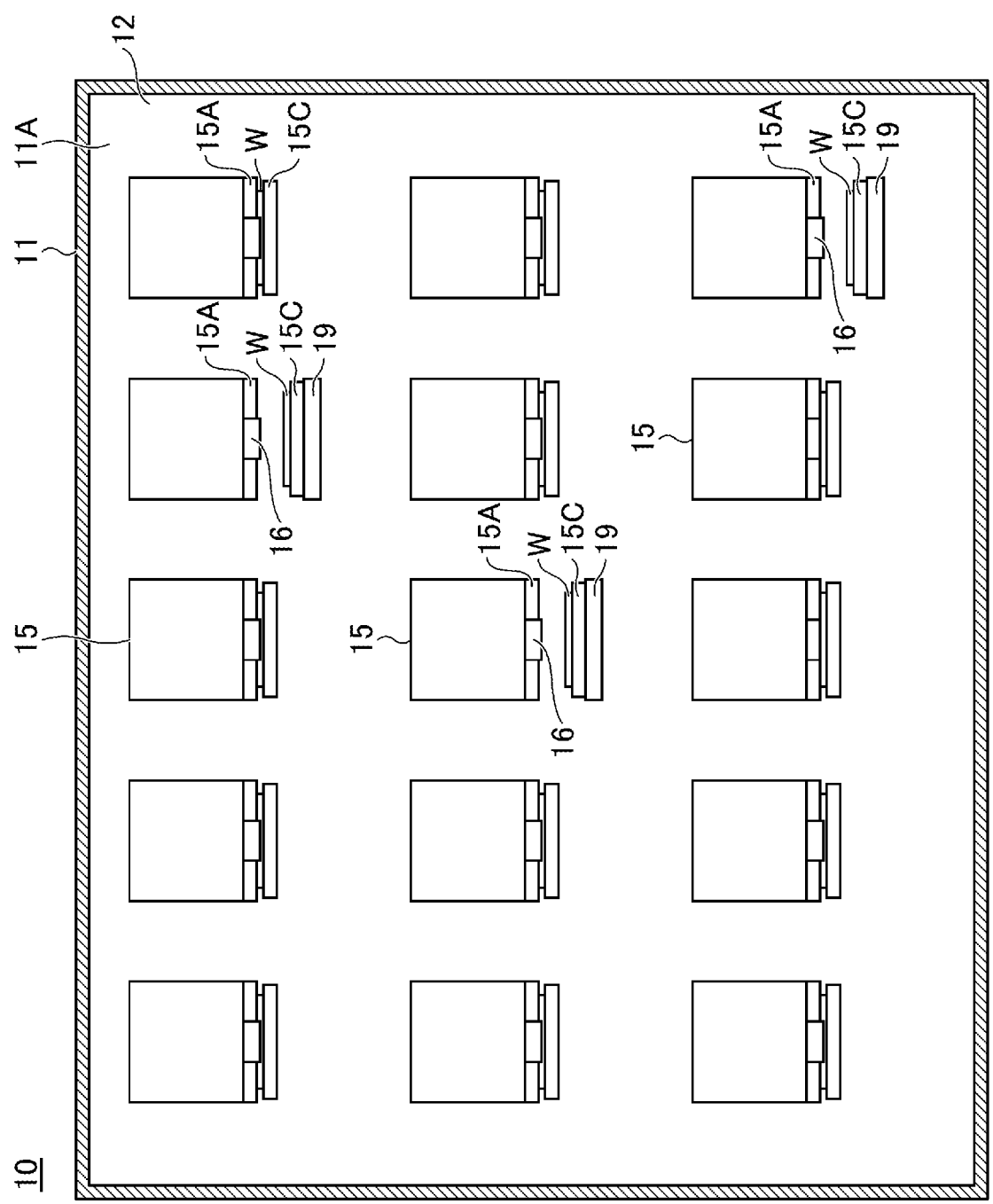
FIG. 2 is a drawing illustrating an example of a cross-sectional view of the entirety of the testing apparatus in a cross-section corresponding to a cross-section viewed from a direction of the arrows AA in FIG. 1.

FIG. 1 is a cross-sectional view illustrating an example of a testing apparatus 10 according to an embodiment. FIG. 2 is a drawing illustrating an example of a cross-sectional view of the entirety of the testing apparatus 10 in a cross-section corresponding to a cross-section viewed from a direction of the arrows AA in FIG. 1. In the following, the XYZ coordinate system, which is an orthogonal coordinate system, is defined for description. The XY plane is a horizontal plane and the Z direction is a vertical direction.

As illustrated in FIG. 1 and FIG. 2, the testing apparatus 10 includes a housing 11. An inner space of the housing 11 is a test chamber 11A. The test chamber 11A includes a test area 12, a transfer area 13, and a load port area 14.

In FIG. 1 and FIG. 2, walls (i.e., walls substantially parallel to the XZ plane) that are partitions between the test area 12, the transfer area 13, and the load port area 14, and openings provided on the walls are omitted.

The test area 12 is an area in which electrical characteristics of an electronic device formed on a wafer W, which is an example of an object to be tested, are tested, and multiple testers 15 that test wafers, a pogo frame 15A, a wafer alignment camera 16, and an aligner 19 are mainly disposed. The tester 15 and the pogo frame 15A are examples of a testing unit. One pogo frame 15A is provided under each tester 15. The wafer alignment camera 16 is an example of a second coordinates obtaining unit, and for example, one wafer alignment camera 16 is provided at a predetermined position next to each pogo frame 15A. In FIG. 1, the wafer alignment camera 16 is under the tester 15 and cannot be seen. As an example, five testers 15 are disposed in the X direction and three stages are provided in the vertical direction in the test area 12. The configuration illustrated in FIG. 1 is one example of a configuration of a portion including the testers 15 at a middle stage, but the configuration of each stage is substantially the same. Multiple testers 15 may be disposed in the X direction and be provided in multiple stages in the vertical direction in the test area 12. One wafer alignment camera 16 may be provided at each stage and may be configured to be moveable in the X direction. Hereinafter, an area in which each tester 15 is disposed is referred to as a cell. For example, there may be 15 cells in the test area 12.

The transfer area 13 is an area provided between the test area 12 and the load port area 14. A rail 18A for guiding a transfer stage 18 in the X direction is provided in the transfer area 13. The transfer stage 18 will be described later.

The load port area 14 is partitioned into multiple accommodation spaces 17. Multiple accommodation spaces 17 are, for example, partitioned into five in the X direction and three in the vertical direction. FIG. 1 illustrates the five accommodation spaces 17 located in the middle of the three stages. In three of the five accommodation spaces 17 in the middle stage, three ports 17a that each accommodate FOUP, which is a container that stores multiple wafers W, are disposed, and in the other two accommodation spaces 17, a controller 17d that controls an operation of each unit of the testing apparatus 10 is disposed. The controller 17d is implemented by a computer including a central processing unit (CPU), a memory, and the like. FOUP is an example of a carrier, and the port 17a is an example of a carrier accommodation room.

Figure 3:
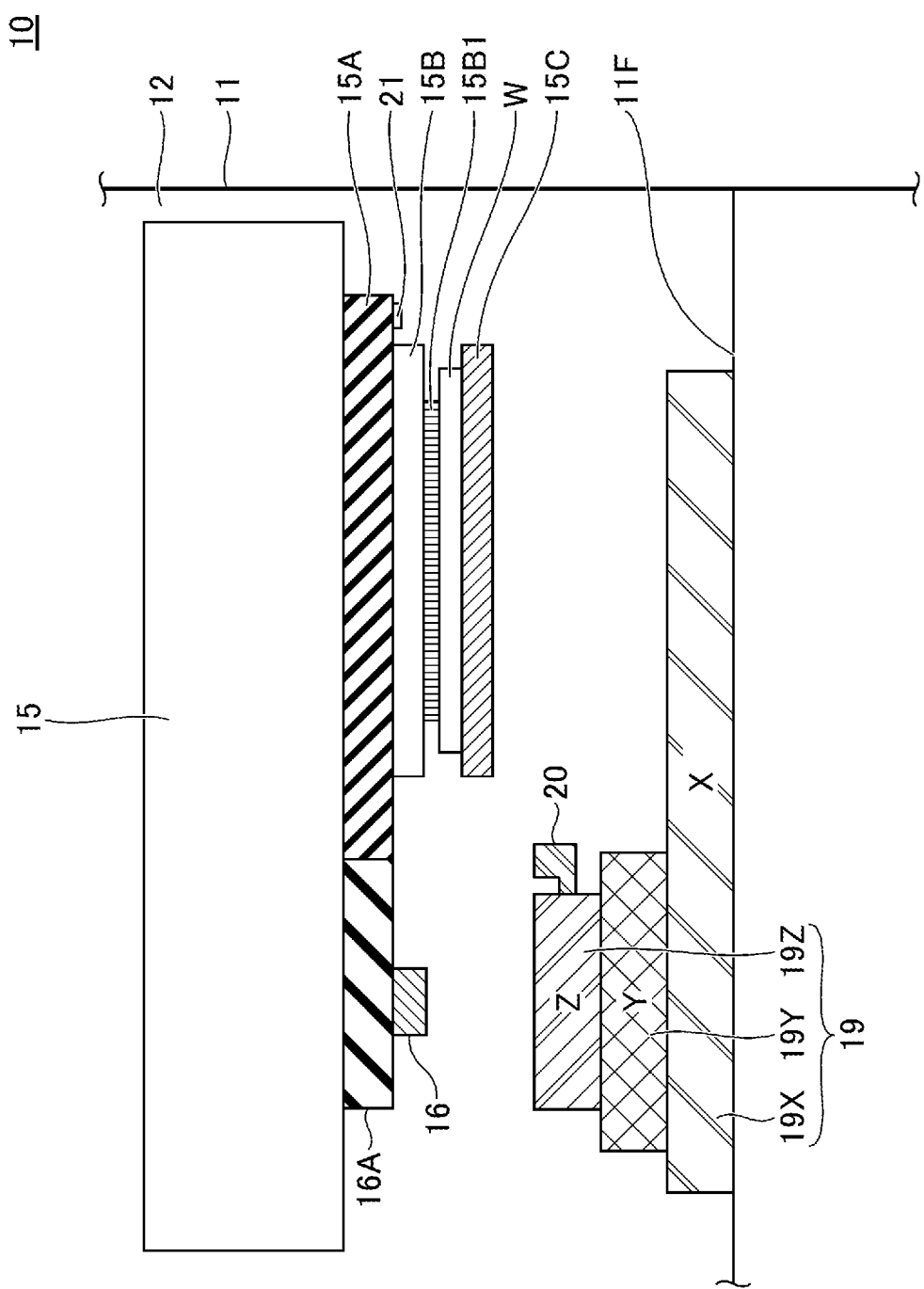
FIG. 3 is a drawing illustrating a cross-sectional structure of a cell.

In the following, FIG. 3 is used for description in addition to FIG. 1 and FIG. 2. FIG. 3 is a drawing illustrating a cross-sectional structure of one cell. FIG. 3 illustrates the structure of one cell, included in one of the three stages in the vertical direction, in the YZ cross-section. FIG. 3 illustrates the tester 15, the pogo frame 15A, a probe card 15B, the wafer W, a chuck 15C, the wafer alignment camera (i.e., an upper camera) 16, a mainframe 16A, an aligner 19, a probe alignment camera (i.e., a lower camera) 20, and a correction target 21. In FIG. 3, the wafer alignment camera 16 is provided on a lower surface of the mainframe 16A provided adjacent to the pogo frame 15A in the −Y direction side on a lower surface of the tester 15. The aligner 19 is provided on a floor 11F of each stage of the housing 11. Driving control of the aligner 19 is performed by the controller 17d.

Under each tester 15, the pogo frame 15A that holds the probe card 15B is provided. The pogo frame 15A may be fixed to the housing 11. The pogo frame 15A includes a pogo pin (which is not illustrated) that contacts a terminal of the electronic device of the wafer W. The terminal of the electronic device of the wafer W is electrically coupled to the tester 15 through the pogo frame 15A. On a lower surface of the pogo frame 15A, the correction target 21 is attached. The correction target 21 is used to obtain a reference position of the aligner 19. For example, the correction target 21 is attached at an end of the lower surface of the pogo frame 15A on the +Y direction side and at the center of the width of the pogo frame 15A in the X direction. The position of the correction target 21 is a position in which the correction target 21 can be imaged by the probe alignment camera 20 when the aligner 19 moves to a contact position where the wafer W contacts the probe 15B1 of the probe card 15B.

The chuck 15C is a thick plate member and has a flat upper surface. The chuck 15C is held by suction to the pogo frame 15A by a vacuum suction mechanism, which is not illustrated, in a state in which the chuck 15C is aligned by the aligner 19 (see FIG. 2) relative to the pogo frame 15A. When the chuck 15C is held by suction at the pogo frame 15A, the probe 15B1 of the probe card 15B is pressed against the terminal of the electronic device of the wafer W. Here, one aligner 19 is provided in each stage. In FIG. 1, the aligner 19 is under one of the five testers 15 and the illustration is omitted. When processing such as alignment and transfer is performed by the aligner 19 at one stage, processing such as alignment and transfer can be performed by the aligner 19 at another stage, thereby improving the throughput of testing the wafer W.

The chuck 15C may include a heating mechanism (i.e., a heater) to heat the wafer W, and may heat the wafer W to a desired temperature when the tester 15 tests the electrical characteristics of the electronic device. The chuck 15C may include a cooling mechanism (i.e., a chiller unit) that cools the chuck 15C by using a cooling liquid.

The wafer alignment camera 16 is an example of a second coordinates obtaining unit and is used as an upper camera. The wafer alignment camera 16 can image a lower side, and for example, a position of the wafer W held on the upper surface of the chuck 15C and a position of the chuck 15C.

The transfer stage 18 is an example of a transfer mechanism. The transfer stage 18 can move in the X direction along the rail 18A within the transfer area 13. The transfer stage 18 includes an arm or the like that can be operated in the Y direction and the Z direction and can transfer the wafer W in the X direction, the Y direction, and the Z direction. The transfer stage 18 receives the wafer W from the port 17a in the load port area 14, transfers the wafer in the X direction in the transfer area 13, and passes the wafer to the aligner 19. The transfer stage 18 receives the wafer W, of which the electrical characteristics of the electronic device has been tested, from the aligner 19, transfers the wafer in the X direction in the transfer area 13, and passes the wafer to the port 17a.

The aligner 19 is an example of an alignment stage and receives the wafer W from the transfer stage 18. The aligner 19 transfers the chuck 15C holding the wafer W to each of the testers 15 and aligns the wafer W relative to the probe card 15B held by the pogo frame 15A. In a state in which such alignment is performed, the chuck 15C may be held by suction at the pogo frame 15A by a vacuum suction mechanism, which is not illustrated. The aligner 19 receives, from the pogo frame 15A, the chuck 15C holding the wafer W of which the electrical characteristics of the electronic device has been tested and passes the wafer W to the transfer stage 18.

The aligner 19 is provided on each of the three stages in the vertical direction. The aligner 19 has a structure in which an X stage 19X, a Y stage 19Y, and a Z stage 19Z are stacked in this order from bottom to top. The X stage 19X can move in the X direction, the Y stage 19Y can move in the Y direction with respect to the X stage 19X, and the Z stage 19Z can move in the Z direction with respect to the Y stage 19Y.

The probe alignment camera 20 is an example of a first coordinates obtaining unit and is used as a lower camera. The probe alignment camera 20 is attached to the Z stage 19Z of the aligner 19 and can image an upper side.

FIGS. 4A, 4B, and 4C are drawings illustrating a correction target 21. As illustrated in FIG. 4A, the correction target 21 may include, for example, 49 targets (i.e., + marks) that are 7×7 targets (height×width). Here, the form in which the target is a+ mark will be described. However, the target is not limited to a+ mark, and may include various symbols, drawings having various shapes, and the like. The correction target 21 is attached to the lower surface of the pogo frame 15A in a state in which each target faces downward. Numbers arranged in two rows and two columns are attached to the right side of each target. For example, an upper right target (00, 00) is a reference target, the upper two-digit number represents the distance from the reference target in the horizontal direction, and the lower two-digit number represents the distance from the reference target in the vertical direction. Therefore, from the reference target (00, 00) to the lower left target (06, 06), upper and lower values are increased by one. The number of the targets is not Limited to 49. Any number of the targets may be used as long as the number of the targets is more than one. The form in which values arranged in two rows and two columns are accompanied with each target on the right side will be described as an example. However, this is not limited to such a form, and any representation of the horizontal and vertical positions of the target from the reference target may be used.

A portion surrounded by the dashed line in FIG. 4A illustrates a field of view when the correction target 21 is imaged by the probe alignment camera 20. A cross at the center of the field of view represents a visual field center 21A (see FIG. 4B and FIG. 4C). The controller 17d selects a target closest to the visual field center 21A (i.e., a+ mark target closest to the visual field center 21A) and reads numerical values accompanied with the target. In FIG. 4B, the result is (03, 02). The controller 17d further obtains the amount of a positional difference (xd, yd) from the visual field center 21A to the closest target in the x direction and the y direction, and calculates the sum of the read numerical values to determine a position of the visual field center 21A in the xy coordinate system of the correction target 21. The xy coordinate system of the correction target 21 corresponds to the XY coordinate of the testing apparatus 10. In the following, the xy coordinate system of the correction target 21 is referred to as the target coordinate system.

Figure 5:
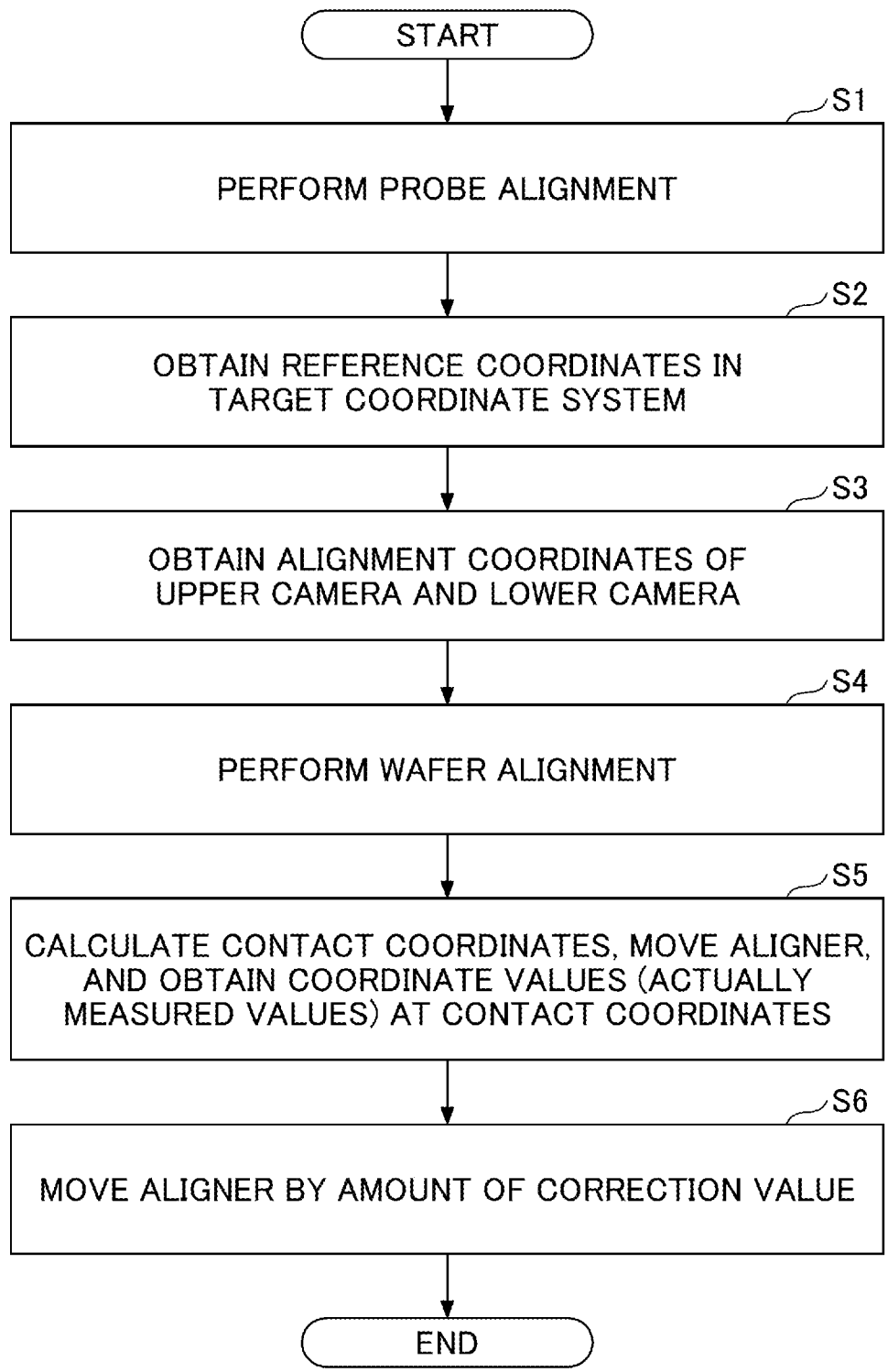
FIG. 5 is a flowchart illustrating an example of a process of causing a wafer to contact with a probe card.

FIG. 5 is a flowchart illustrating an example of a process of causing the wafer W to contact the probe card 15B. The process illustrated in FIG. 5 is performed by the controller 17d. In addition to FIG. 5, FIGS. 6A, 6B, and 6C and FIGS. 7A, 7B, and 7C will be used for description. FIGS. 6A, 6B, and 6C and FIGS. 7A, 7B, and 7C illustrate an example of a process of causing the wafer W to contact the probe card 15B. FIGS. 6A, 6B, and 6C and FIGS. 7A, 7B, and 7C schematically illustrate positions of the probe card 15B, the wafer alignment camera 16, and the correction target 21 on a pogo frame 15A side, and positions of the wafer W and the probe alignment camera 20 on an aligner 19 side. The chuck 15C is omitted.

Here, distortion may occur in the frame of the testing apparatus 10, due to changes in the center of gravity of the testing apparatus 10 that may occur due to the movement of three aligners 19 in the X direction, due to expansion or contraction caused by the temperature, or the like. Such distortion may be on the order of micrometers. When the aligner 19 is moved by a command that causes the aligner 19 to move to the contact position, misalignment may occur at the contact position every time the aligner 19 moves due to the distortion described above. The testing apparatus 10 and a method of controlling the testing apparatus according to the embodiment correct such misalignment and improve the positional accuracy when the wafer W is moved to a position where the wafer W comes in contact with the probe 15B1 of the probe card 15B.

Figure 6C:
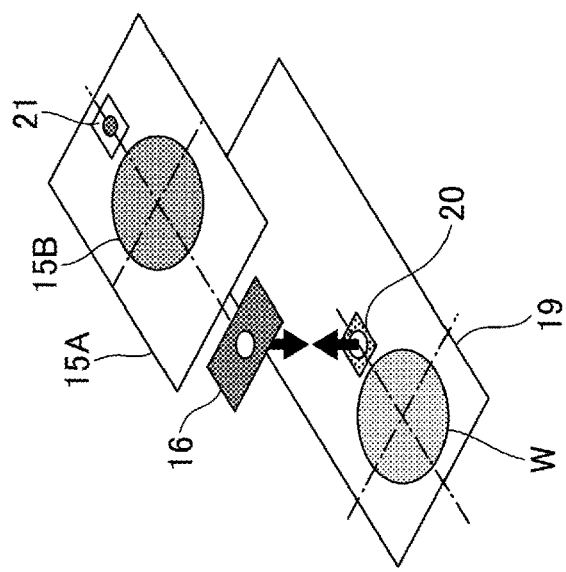
FIGS. 6A, 6B, and 6C are drawings illustrating an example of the process of causing the wafer to contact with the probe card.
Figure 6B:
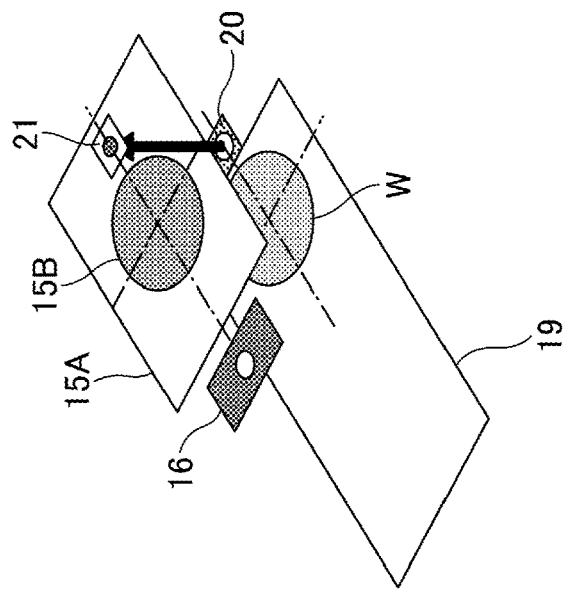
Figure 6A:
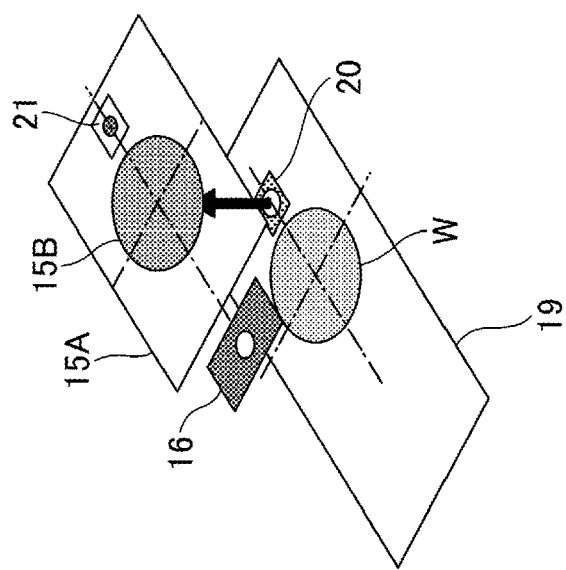

In step S1, the controller 17d performs probe alignment. Specifically, as illustrated in FIG. 6A, the probe alignment camera 20 provided in the aligner 19 is moved directly under the probe card 15B to obtain card gravity center coordinates representing a position of the probe card 15B.

In step S2, the controller 17d obtains the reference coordinates in the target coordinate system by moving the aligner 19 with a command that causes the aligner 19 to move to the contact position and imaging the correction target 21 with the probe alignment camera 20. The position of the correction target 21 is at a position where the correction target 21 can be imaged by the probe alignment camera 20 when the aligner 19 moves to the contact position. Thus, when the aligner 19 is moved with a command that causes the aligner 19 to move to the contact position, the probe alignment camera 20 moves directly under the correction target 21, as illustrated in FIG. 6B. In this state, the controller 17d obtains, as the reference coordinates, coordinates of the visual field center 21A in the target coordinate system (see FIG. 4B and FIG. 4C) obtained by imaging the correction target 21 with the probe alignment camera 20. Due to misalignment caused by distortion of the testing apparatus 10 due to a change in the temperature, a movement of the center of gravity, or the like, the reference coordinates in the target coordinate system obtained in step S2 may differ from coordinates on the aligner 19 side (i.e., coordinates in a coordinate system of the testing apparatus) every time. The reference coordinates in the target coordinate system is a position that is used as a reference every time a process from step S1 to step S6 is performed.

In step S3, the controller 17d aligns the upper and lower cameras. Specifically, as illustrated in FIG. 6C, the controller 17d moves the wafer alignment camera 16 to a predetermined position and moves the aligner 19 to align an axis of the wafer alignment camera 16 and an axis of the probe alignment camera 20, so that the controller 17d obtains alignment coordinates of the wafer alignment camera 16 and the probe alignment camera 20, thereby, obtaining a corresponding relationship between the coordinates of the wafer alignment camera 16 and the coordinates of the probe alignment camera 20.

In step S4, the controller 17d performs wafer alignment. Specifically, the controller 17d obtains a position of the wafer W on the aligner 19 (i.e., wafer gravity center coordinates) by using the wafer alignment camera 16, as illustrated in FIG. 7A.

In step S5, the controller 17d calculates coordinates of a contact position to which the aligner 19 is moved to allow the wafer W to contact with the probe card 15B (i.e., contact coordinates) based on the card gravity center coordinates, the alignment coordinates, and the wafer gravity center coordinates. In a state in which the aligner 19 is moved with a command including the calculated contact coordinates, the controller 17d obtains coordinate values (i.e., actually measured values) of the correction target 21 at the contact coordinates by imaging the correction target 21 by using the probe alignment camera 20, as illustrated in FIG. 7B.

In step S6, the controller 17d calculates theoretical coordinates of the correction target 21 observed at the contact position based on the contact coordinates calculated in step S5 and the reference coordinates of the correction target observed in step S2. The difference between the theoretical coordinates of the correction target 21 and the coordinates of the correction target 21 (i.e., actually measured values) actually observed at the contact coordinates is a correction value. The controller 17d moves the aligner 19 by the amount specified by the correction value.

Figure 8:
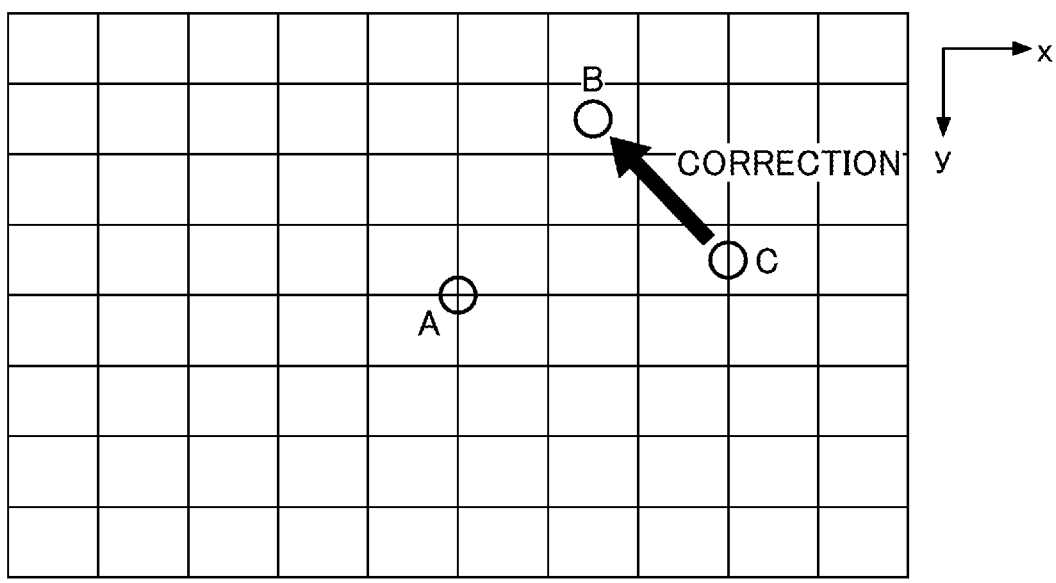
FIG. 8 is a drawing illustrating reference coordinates, theoretical coordinates, and actually measured coordinates in a target coordinate system.

Specific description is as follows. Here, the description refers to FIG. 8 as well as FIG. 7C. FIG. 8 is a drawing illustrating reference coordinates A, theoretical coordinates B of the correction target 21, and coordinates C in step S5 (i.e., actually measured values), in the target coordinate system. The reference coordinates A are coordinates obtained in step S2. The theoretical coordinates B of the correction target 21 is an example of reference contact coordinates, and the coordinates C in step S5 (i.e., actually measured values) are an example of actual contact coordinates.

The theoretical coordinates B of the correction target 21 are coordinates calculated based on a design value of the testing apparatus 10 by using the reference coordinates A as a reference. However, the aligner 19 moves to coordinates in the XYZ coordinate system corresponding to the coordinates C (i.e., actually measured value) because misalignment may occur due to distortion of the testing apparatus 10, individual differences in the probe card 15B, or the like, even when the aligner is moved with a command including the contact coordinates.

Thus, in step S6, the controller 17d determines a difference between the theoretical coordinates B of the correction target 21 and the coordinates C of the correction target 21 (i.e., actually measured values) as a correction value and moves the aligner 19 by the amount of the correction values, as illustrated in FIG. 7C. As a result, the aligner 19 can move to the contact coordinates and allow the wafer W to contact the probe 15B1 of the probe card 15B in a state in which the misalignment is corrected.

As described above, in step S2, the correction target 21 is imaged by the probe alignment camera 20 to obtain the reference coordinates A in the target coordinate system. The position of the aligner 19 is corrected by using the difference between the coordinates C, obtained at the position where a command including the contact coordinates (actually measured values) has moved the aligner 19, and the theoretical coordinates B of the correction target 21. Therefore, the aligner 19 can be moved to the correct position by offsetting misalignment caused by distortion of the testing apparatus 10, individual differences in the probe card 15B, or the like.

Thus, a testing apparatus 10 with improved positional accuracy when the wafer W placed on the aligner 19 (i.e., the alignment stage) is moved to a position in which the wafer W contacts the probe 15B1 of the probe card 15B and a method of controlling the testing apparatus 10 can be provided.

The correction of such misalignment can be performed every time the process from step S1 to step S6 of the flowchart illustrated in FIG. 5 is performed. That is, the correction can be performed each time an electronic device is tested for each wafer W. Thus, the wafer W can contact the probe 15B1 at a precise location every time the wafer W is tested, so that a testing apparatus 10 that reduces the test time and that performs a test with high throughput can be provided. Additionally, a manual adjustment of the misalignment requires an enormous amount of time. However, by using the correction target 21, the position can be easily adjusted in a very short period of time, thereby tests may be performed with high throughput.

Although a configuration in which the testing apparatus 10 includes multiple testers 15 has been described above, the number of the testers 15 included in the testing apparatus 10 may be one. Although the configuration in which the chuck 15C is held by suction at the pogo frame 15A has been described, the chuck 15C may be configured to be pressed against the pogo frame 15A by the aligner 19.

Although a configuration in which the wafer gravity center coordinates or the like are obtained by using the wafer alignment camera 16 has been described, a sensor that can obtain the wafer gravity center coordinates or the like may be used instead of the wafer alignment camera 16. Similarly, although the configuration in which the card gravity center coordinates and the reference coordinates are obtained by using the probe alignment camera 20 has been described, a sensor that can obtain the card gravity center coordinates and the reference coordinates may be used instead of the probe alignment camera 20.

Embodiments of the testing apparatus and a method of controlling the testing apparatus according to the present disclosure have been described above, but the present disclosure is not limited to the above-described embodiments. Various changes, modifications, substitutions, additions, deletions, and combinations can be made within the scope of the recited claims. They are, of course, within the technical scope of the present disclosure.

What is claimed is:

1. A testing apparatus comprising:
   an alignment stage;
   a pogo frame provided opposite to the alignment stage;
   a reference target provided on the pogo frame;
   a first coordinates obtaining unit fixed relative to the alignment stage;
   a second coordinates obtaining unit fixed relative to the pogo frame; and
   a controller configured to perform processes of
   determining card gravity center coordinates of a probe card held at the pogo frame by using the first coordinates obtaining unit, the card gravity center coordinates being coordinates in a coordinate system of the testing apparatus,
   positioning the alignment stage at a predetermined position and determining reference coordinates of the first coordinates obtaining unit by using the first coordinates obtaining unit in response to the alignment stage being positioned at the predetermined position, the reference coordinates being coordinates in a target coordinate system, and an origin of the target coordinate system being the reference target, aligning the first coordinates obtaining unit with the second coordinates obtaining unit and determining alignment coordinates of the first coordinates obtaining unit in response to the first coordinates obtaining unit being aligned with the second coordinates obtaining unit, the alignment coordinates being coordinates in the coordinate system of the testing apparatus, determining wafer gravity center coordinates of a wafer placed on the alignment stage by using the second coordinates obtaining unit, the wafer gravity center coordinates being coordinates in the coordinate system of the testing apparatus, calculating contact coordinates of the alignment stage based on the determined card gravity center coordinates, the determined alignment coordinates, and the determined wafer gravity center coordinates, the contact coordinates being expected to be coordinates to which the alignment stage is moved to allow the wafer to come in contact with the probe, positioning the alignment stage by using a command including the calculated contact coordinates and determining actual contact coordinates of the first coordinates obtaining unit by using the first coordinates obtaining unit in response to the alignment stage being positioned by using the command including the calculated contact coordinates, the actual contact coordinates being in the target coordinate system, calculating reference contact coordinates based on the determined reference coordinates, the reference contact coordinates being coordinates of the first coordinates obtaining unit as would be observed when the alignment stage is assumed to be situated at the calculated contact coordinates to allow the wafer to come in contact with the probe, and the reference contact coordinates being in the target coordinate system, and causing the wafer to contact the probe by correcting a position of the alignment stage based on a positional difference between the determined actual contact coordinates and the calculated reference contact coordinates.

2. The testing apparatus as claimed in claim 1, wherein the first coordinates obtaining unit is a first camera attached to the alignment stage.

3. The testing apparatus as claimed in claim 1, wherein the second coordinates obtaining unit is a second camera attached to the pogo frame.

4. The testing apparatus as claimed in claim 1, wherein the second coordinates obtaining unit is a second camera that can move, in a case where a plurality of testers are arrayed, along a direction in which the plurality of testers are arrayed, each of the plurality of testers being provided to a corresponding one of a plurality of said pogo frames.

5. The testing apparatus as claimed in claim 1, wherein the reference contact coordinates are obtained based on a design value of the testing apparatus.

6. A method of controlling a testing apparatus comprising:

determining card gravity center coordinates of a probe card held at a pogo frame opposite to an alignment stage by using a first coordinates obtaining unit fixed relative to the alignment stage, the card gravity center coordinates being coordinates in a coordinate system of the testing apparatus;

positioning the alignment stage at a predetermined position and determining reference coordinates of the first coordinates obtaining unit by using the first coordinates obtaining unit in response to the alignment stage being positioned at the predetermined position, the reference coordinates being coordinates in a target coordinate system, and an origin of the target coordinate system being a reference target provided on the pogo frame;

aligning the first coordinates obtaining unit with a second coordinates obtaining unit fixed relative to the pogo frame and determining alignment coordinates of the first coordinates obtaining unit in response to the first coordinates obtaining unit being aligned with the second coordinates obtaining unit, the alignment coordinates being coordinates in the coordinate system of the testing apparatus;

determining wafer gravity center coordinates of a wafer placed on the alignment stage by using the second coordinates obtaining unit, the wafer gravity center coordinates being coordinates in the coordinate system of the testing apparatus;

calculating contact coordinates of the alignment stage based on the determined card gravity center coordinates, the determined alignment coordinates, and the determined wafer gravity center coordinates, the contact coordinates being expected to be coordinates to which the alignment stage is moved to allow the wafer to come in contact with the probe;

positioning the alignment stage by using a command including the calculated contact coordinates and determining actual contact coordinates of the first coordinates obtaining unit by using the first coordinates obtaining unit in response to the alignment stage being positioned by using the command including the calculated contact coordinates, the actual contact coordinates being in the target coordinate system, calculating reference contact coordinates based on the determined reference coordinates, the reference contact coordinates being coordinates of the first coordinates obtaining unit as would be observed when the alignment stage is assumed to be situated at the calculated contact coordinates to allow the wafer to come in contact with the probe, and the reference contact coordinates being in the target coordinate system; and causing the wafer to contact the probe by correcting a position of the alignment stage based on a positional difference between the determined actual contact coordinates and the calculated reference contact coordinates.

\* \* \* \* \*